United States Patent
Behziz et al.

(10) Patent No.: US 7,649,375 B2
(45) Date of Patent: Jan. 19, 2010

(54) CONNECTOR-TO-PAD PRINTED CIRCUIT BOARD TRANSLATOR AND METHOD OF FABRICATION

(75) Inventors: Arash Behziz, Thousand Oaks, CA (US); Roya Yaghmai, Los Angeles, CA (US)

(73) Assignee: TERADYNE, Inc., Boston, MA (US)

( * ) Notice: Subject to any disclaimer, the term of this patent is extended or adjusted under 35 U.S.C. 154(b) by 0 days.

(21) Appl. No.: 11/474,921

(22) Filed: Jun. 26, 2006

(65) Prior Publication Data

US 2007/0007034 A1    Jan. 11, 2007

Related U.S. Application Data

(60) Provisional application No. 60/695,516, filed on Jun. 30, 2005.

(51) Int. Cl.
*G01R 31/26* (2006.01)
*G01R 31/28* (2006.01)

(52) U.S. Cl. .................... 324/765; 324/158.1

(58) Field of Classification Search ............. 324/158.1, 324/754–765; 257/48; 438/14–18
See application file for complete search history.

(56) References Cited

U.S. PATENT DOCUMENTS

| | | | | | |
|---|---|---|---|---|---|
| 4,771,236 | A | * | 9/1988 | Banks | 324/158.1 |
| 5,262,719 | A | * | 11/1993 | Magdo | 324/158.1 |
| 5,600,259 | A | * | 2/1997 | Bartyzel et al. | 324/761 |
| 5,897,728 | A | * | 4/1999 | Cole et al. | 156/155 |
| 6,292,006 | B1 | * | 9/2001 | Fredrickson | 324/754 |
| 6,555,897 | B2 | * | 4/2003 | Stroupe | 257/666 |
| 6,559,668 | B1 | * | 5/2003 | Tervo et al. | 324/762 |
| 6,756,797 | B2 | * | 6/2004 | Brandorff et al. | 324/754 |
| 7,388,394 | B1 | * | 6/2008 | Primavera et al. | 324/765 |
| 2004/0179343 | A1 | * | 9/2004 | Karavakis et al. | 361/771 |
| 2004/0257098 | A1 | | 12/2004 | Satou | |
| 2005/0036374 | A1 | | 2/2005 | Nakashima et al. | |

FOREIGN PATENT DOCUMENTS

EP    0 971 570 A1    1/2000

OTHER PUBLICATIONS

Dietz, Karl, Minimizing Via-field Effects on Signal Integrity, www.boardauthority.com/CDA/ArticleInformation/features/BNP_Features_Item/0,2133,133631,00.html, CircuiTree: Tech Talk, Oct. 1, 2004.

\* cited by examiner

*Primary Examiner*—Ha Tran T Nguyen
*Assistant Examiner*—Joshua Benitez
(74) *Attorney, Agent, or Firm*—Christopher R. Balzan

(57) ABSTRACT

In one embodiment, a laminated printed circuit board translator is provided. In some embodiments, the translator includes a receiving board adapted to receive a pin, the receiving board includes a plated via extending through the receiving board and has a hole for receiving a pin. An interface board laminated with the receiving board has a controlled depth via extending through it to contact a conductive trace. The conductive trace extends between the receiving board and the interface board to connect the plated via of the receiving board with the controlled depth via of the interface board. The controlled depth via is configured so that it is capable of being plated through a single sided drilled opening in the interface board. Some embodiments have a pad on the interface board connected to the controlled depth via.

32 Claims, 1 Drawing Sheet

CONNECTOR-TO-PAD PRINTED CIRCUIT BOARD TRANSLATOR AND METHOD OF FABRICATION

CROSS REFERENCE TO RELATED APPLICATION

This application claims the benefit of U.S. Provisional Patent Application No. 60/695,516, filed on Jun. 30, 2005, by Arash Behziz, et al., entitled, CONNECTOR-TO-PAD PRINTED CIRCUIT BOARD TRANSLATOR AND METHOD OF FABRICATION, herein incorporated by reference in its entirety.

BACKGROUND

One way to provide inexpensive connection is to provide a connector, such as surface mount connector, a press fit connector, a pin or wire insertion, or other interference fit connection. Off the shelf connectors may not always have the proper density to connect to a corresponding interface. Further the corresponding interface may not accept pin insertion connections, or accept the particular layout out configuration of the off the shelf connector. Thus, a particular off the shelf connector typically will not provide sufficient density, and/or an acceptable connection type and configuration so that it can be used to reduce costs in existing interfaces. As such, it is often not possible to use inexpensive off the shelf connectors with surface mount connections, or with pin insertion or other interference type connections.

Another problem encountered with an insertion type connection is that the pressure needed to create the interference fit can cause flexing of the corresponding interface. This can lead to mechanical failure of the interface. Conventional solid, surface mount interfaces, on the other hand, can be bulky and expensive to make.

What is needed is a means capable of providing a low cost rigid interface for insertion type connection. Moreover, what is also needed is a means capable of providing a high density interface capable of use in surface mount and/or interference fit connections. Further, what is needed is a means that allows the use of off-the-self connectors in different non-off-the-shelf pin-out configurations.

SUMMARY

In one embodiment, a laminated printed circuit board translator is provided. In some embodiments, the translator includes a receiving board adapted to receive a connector mounted thereon, the receiving board includes a plated via extending through the receiving board. An interface board laminated with the receiving board has a controlled depth via extending through it to contact a conductive trace. The conductive trace extends between the receiving board and the interface board. The conductive trace may be formed in/on the receiving board prior to lamination with the interface board. The conductive trace connects the plated via of the receiving board with the controlled depth via of the interface board. The controlled depth via may be configured so that it is capable of being plated through a single sided drilled opening in the interface board. In some embodiments, the interface board has a pad thereon connected to the controlled depth via.

In one implementation, a method for fabricating a sequentially laminated printed circuit board is provided. Some implementations include plating a through hole via in a receiving board, forming a trace on the receiving board, and laminating the receiving board and an interface board so that the trace is located between the receiving board and the interface board. After laminating, a hole is drilled in the interface board to the trace. The hole is plated to form the controlled depth via.

BRIEF DESCRIPTION OF THE DRAWINGS

The features and advantages of the present invention will be better understood with regard to the following description, appended claims, and accompanying drawings where:

DESCRIPTION

Figure 1:
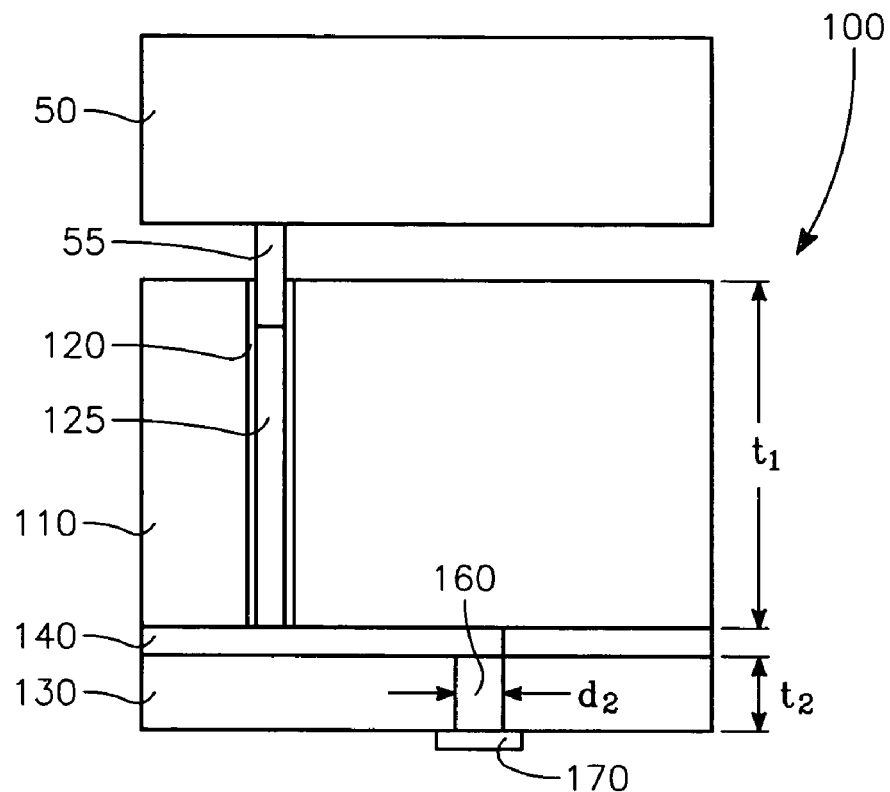
FIG. 1 is a simplified illustration showing a cut away side view of one embodiment of a translator.

FIG. 1 is a simplified illustration showing a cut away side view of one embodiment of a translator 100. In this embodiment, the translator 100 is adapted to receive a pin 55 from a pin insertion component 50 such as a press fit connector, or an another interference fit insertion connection. In other embodiments, a surface mount connector (not shown), without pin 55 extending into the receiving board 110, may be mounted to the receiving board 110. The translator 100 includes a receiving board 110 laminated with an interface board 130. The receiving board 110 and the interface board 130 may be fabricated with printed circuit board sequential lamination technology known in the art.

A plated via 120 extends through the receiving board 110 to connect to a conductor trace 140. The plated via 120 has a hole 125 through it capable of holding the pin 55 in an interference fit, interlocking fit, or other press fit, or by solder or other conductive bond between the plated via 120 and the pin 55. In one embodiment, the plated via 120 is formed in the receiving board 110 as a through hole via, along with the conductor trace 140 prior to joining the receiving board 110 to the interface board 130. Thus, in some embodiments, after the plated via 120 and the conductor trace 140 are formed in/on the receiving board 110, the receiving board 110 and the interface board 130 are bonded together. In some embodiments, this may be accomplished using prepreg, as is known in the art.

The conductor trace 140 located between the receiving board 110 and the interface board 130 connects the plated via 120 with a controlled depth via 160. The controlled depth via 160 connects with the conductor trace 140 and extends through the interface board 130.

The controlled depth via 160 may be formed by mechanically drilling through the interface board 130 after it is secured to the receiving board 110. After drilling, the controlled depth via 160 may be plated so that it has a hole (not shown) through it. The controlled depth via 160 may be filled if desired. One advantage of drilling and plating the controlled depth via 160 after laminating it to the receiving board 110 is that it allows the controlled depth via 160 and the conductor trace 140 to form a good electrical connection. Because the hole is drilled after joining the interface board 130 to the receiving board 110, a portion (not shown) of the conductor trace 140 is cut into so that the controlled depth via 160 to connect to during the plating process. The drilled hole may be a controlled depth drilling process such that the hole extends to at least the conductor trace 140, or somewhat beyond, so that the controlled depth via 160 contacts the conductor trace 140.

In one implementation, the controlled depth via 160 is a blind via which is sized so that the plating process, performed from one side of the interface board 130 after it is joined with the receiving board 110, causes plating material to connect the controlled depth via 160 to the conductor trace 140. In some embodiments the diameter $d_2$ of the drilled hole to the depth $t_2$ of the controlled depth via 160 is greater than about one and four tenths to one, so that the plating material can plate the controlled depth via 160 from the one sided opening formed by the drilling process. For example in one embodiment, the thickness $t_2$ of the interface board 130 is about four mils and the diameter $d_2$ of hole for the controlled depth via 160 is about thirteen and one half mils. In another embodiment the thickness $t_2$ of the interface board 130 is about nine and six tenths mils and the diameter $d_1$ of the hole is about thirteen and one half mils. The thickness $t_1$ of the receiving board 110 may be many orders of magnitude larger. Thus, in some embodiments, the diameter $d_2$ of the drilled hole must be large enough while the thickness $t_2$ of the interface board must be thin enough to allow the controlled depth via to plate from the single opening provided by the drilling process.

In some embodiments, an optional pad 170 may be provided to facilitate connection to pogo pins, an interposer, or other compliant connector (not shown). In some embodiments, the pad 170 may be provided to facilitate conductive bonding, such as with solder bonding (not shown), conductive epoxy (not shown), ect. In other embodiments, such a connection may be made directly to the controlled depth via 160.

The pressure used to insert pin 55 or other interference fit connection, has the potential to cause flexing, which could lead to mechanical failure of the interface. An advantage of some embodiments is that in the case where more force is used to secure the interference fit, the thickness the interface board 130 may be selected to provide additional mechanical rigidity. Further, the thickness of the interface board 130 may be selected to ensure that the pin 55 does not protrude through the interface board 130 to a contact pad (not shown), which could be located below it.

An advantage of some embodiments, as illustrated in FIG. 1, is that the controlled depth via 160 and pad 170 need not be located below the plated via 120 and pin 55. Connection of the controlled depth via 160 (and pad 170) of the interface board 130, to the plated via 120 (and pin 55) with the conductor trace 140 allows the signals to be routed from any position on the receiving board 110 to any position, or pad, of an interface board 130. Thus, some embodiments provide internal routing of signals within the translator, rather than on an exposed surface of either the receiving board 110 or the interface board 130. This allows the controlled depth via 160 to be offset from the plated via 120.

Yet another advantage of some embodiments is that the plating material of the plated via 120 can be selected to accommodate pin insertion connection, while material of the pad 170 and/or the controlled depth via 160 may be selected to accommodate a compliant connection, or a solder connection, conductive epoxy, etc., at the exposed surface of the interface board 130. For example, the plated via 120 may be a softer material that includes copper, copper alloy, tin, tin alloy, tin plated gold, or the like. The pad 170 may be a material such as gold. Or, in some embodiments, the pad 170 could be a solder compatible pad.

Still another advantage of some embodiments is that they allow a pad pattern to be located independent the configuration of the pins. In some embodiments, this can allow higher density than is possible if the pin insertion component is directly connected to an interface. Thus, it can allow funneling of signals from a lower density to a higher density. For example, connectors, individual pins, and/or wires, i.e. axial or coaxial wires, could be inserted in plated vias 120 of the receiving board 110 for funneling to higher density connection at the interface board 130. In addition, it is not required that the plated via 120 extend all the way through the translator 100, i.e., the plated via 120 may be formed as a through hole via in the receiving board 110 before lamination, so it does not extend through the interface board 130.

For simplicity, only a single pin 55 of a pin insertion component 50 is shown. Similarly, only the corresponding plated via 120, conductor trace 140, and controlled depth via 160 are shown for simplicity. Further, the pin 55 could be from a surface mount component or other device having connection pins. In other embodiments, a surface mount connector having leads mounted to the plated vias, rather than pins, is possible.

Furthermore, the pad 170 need not be centered over the controlled depth via 160 as shown in FIG. 1. Moreover, as is known in the art, the arrangement of signal and return pads, and vias may vary depending on the application.

For illustration purposes, only a single routing layer laminated translator is shown. In other embodiments not shown, one or more additional routing layers are possible. For example, in one embodiment the receiving board could include another routing layer. Other embodiments are possible.

Figure 2:
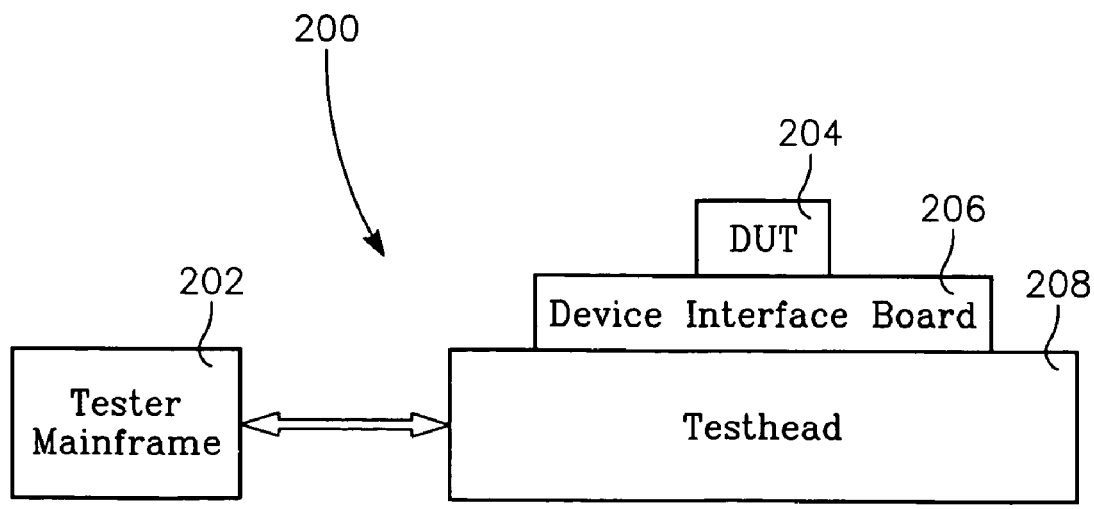
FIG. 2 is a block diagram of one embodiment of a tester which may include the translator.

FIG. 2 is a block diagram of one embodiment of a tester 200 which may include the translator 100 (shown in FIG. 1). The tester 200 includes a tester mainframe 202 that is in communication with a test head 208. The test head 208 is connected to an interface board 206. In some embodiments, signals from the test head 208 may be routed to the interface board 206 through the translator (not shown in FIG. 2). In the embodiment shown in FIG. 2, the interface board 206 is a device interface board or DIB. In operation, the interface board 206 is electrically connected to a device under test (DUT) 204 for testing the DUT 204. For example, the tester 200 may be an automated test equipment (ATE) system for testing integrated circuits, and the DUT 204 may be a semiconductor device including an integrated circuit. In some embodiments, signals from the test head 208 are routed to the interface board 206 through the translator (not shown in FIG. 2).

The tester mainframe 202 includes circuitry for generating test signals and evaluating test signals. The tester mainframe 202 sends test signals to the DUT 204 and receives test signals from the DUT 204 through the test head 208 and the interface board 206. The DUT 204 may be a packaged silicon die including an integrated circuit to be tested. In another embodiment, the interface board 206 is a probe interface board, and the DUT 204 may be a semiconductor wafer including an integrated circuit to be tested.

Having described this invention in connection with a number of embodiments, modification will now certainly suggest itself to those skilled in the art. As such, the invention is not limited to the disclosed embodiments, except as required by the appended claims. One or more of the embodiments above may have one or more of the advantages discussed herein. There may be other advantages that become evident upon reading of the description.

What we claim is:

1. A laminated printed circuit board translator comprising:
   a) a receiving board adapted to receive a connector mounted thereon, the receiving board comprising a plated via extending through the receiving board;
   b) an interface board laminated with the receiving board, the interface board comprising a controlled depth via extending through the interface board offset from the plated via;

c) a conductive trace extending between the receiving board and the interface board to connect the plated via of the receiving board with the controlled depth via of the interface board; and d) wherein the controlled depth via extends into and through the conductive trace and only part way into the receiving board.

2. The translator of claim 1, wherein the plated via comprises a hole therethrough, and wherein the hole extends through the receiving board.

3. The translator of claim 1, wherein the controlled depth via is a plated via.

4. The translator of claim 1, wherein the controlled depth via is a filled via.

5. The translator of claim 1, wherein the controlled depth via has a diameter-to-depth ratio such that the controlled depth via is constructed to be plated as a blind via.

6. The translator of claim 1 further comprising at least one additional printed circuit board laminated between the receiving board and the interface board, the at least one additional printed circuit board comprising an internal via extending through the at least one additional printed circuit board, and wherein the conductive trace comprises a first portion connecting the plated via with the internal via and a second portion connecting the internal via to the controlled depth via.

7. The translator of claim 1 further comprising a pad on a surface of the interface board connected to the controlled depth via.

8. The translator of claim 1, wherein the receiving board is adapted to mount with at least one of: (a) press fit component; or (b) a surface mount component.

9. The translator of claim 1, wherein the interface board is constructed to mount using at least one of: (a) a compliant connection; or (b) electrically conductive bonding material.

10. A laminated printed circuit board translator comprising:

a) a receiving board adapted to receive an interference fit insertion connection therein, the receiving board comprising a plated via extending through the receiving board;

b) an interface board laminated with the receiving board, the interface board comprising a controlled depth via extending through the interface board offset from the plated via;

c) a conductive trace extending between the receiving board and the interface board to connect the plated via of the receiving board with the controlled depth via of the interface board; and d) wherein the controlled depth via extend only part way into the conductive trace without extending through the conductive trace.

11. The translator of claim 10, wherein the plated via comprises a hole therethrough, and wherein the hole extends through the receiving board.

12. The translator of claim 10, wherein the controlled depth via is a plated via.

13. The translator of claim 10, wherein the controlled depth via is a filled via.

14. The translator of claim 10, wherein the controlled depth via has a diameter-to-depth ratio such that the controlled depth via is constructed to be plated as a blind via.

15. The translator of claim 10, further comprising a pad on a surface of the interface board connected to the controlled depth via.

16. The translator of claim 10, further comprising at least one additional printed circuit board laminated between the receiving board and the interface board, the at least one additional printed circuit board comprising an internal via extending through the at least one additional printed circuit board, and wherein the conductive trace comprises a first portion connecting the plated via with the internal via and a second portion connecting the internal via to the controlled depth via.

17. The translator of claim 10, the interface board is constructed to mount with at least one of: (a) a compliant connection; or (b) electrically conductive bonding material.

18. The translator of claim 10, wherein the receiving board is constructed to receive an interference fit insertion connection comprising at least one of: (a) a component; (b) a connector; (c) a pin; or (d) a wire.

19. An automated tester comprising:

d) a tester mainframe;

e) a test head in communication with the tester mainframe;

f) a device interface board in connection with the test head via a translator, the translator comprising;

(1) a receiving board constructed to receive at least one of: (i) a surface mount connector; or (ii) an interference fit insertion connection, the receiving board comprising a plated via extending through the receiving board;

(2) a translator interface board laminated with the receiving board, the translator interface board comprising a controlled depth via extending through the translator interface board offset from the plated via;

(3) a conductive trace extending between the receiving board and the translator interface board to connect the plated via of the receiving board with the controlled depth via of the translator interface board; and (4) wherein the controlled depth via is formed after the transistor interface board is laminated with the receiving board, the controlled depth via extending into and through the conductive trace and only part way into the receiving board.

20. The tester of claim 19, wherein the plated via comprises a hole therethrough, and wherein the hole extends through the receiving board, and wherein the controlled depth via comprises one of: (a) a plated via; or (b) a filled via.

21. The tester of claim 19, wherein the controlled depth via has a diameter-to-depth ratio such that the controlled depth via is capable of being plated as a blind via.

22. The tester of claim 19, further comprising a pad on a surface of the translator interface board connected to the controlled depth via.

23. The tester of claim 19, wherein the translator interface board is constructed to mount with at least one of: (a) a compliant connection; or (b) electrically conductive bonding material.

24. The tester of claim 19, wherein the receiving board is adapted to receive an interference fit insertion connection comprising at least one of: (a) a component; (b) a connector; (c) a pin; or (d) a wire.

25. The translator of claim 1, wherein the plated via in the receiving board does not extend into the interface board.

26. The translator of claim 1, wherein the plated via in the receiving board does not extend beyond the receiving board.

27. The translator of claim 10, wherein the plated via is constructed to receive an interference fit insertion pin therein.

28. The translator of claim 10, wherein the plated via in the receiving board does not extend into the interface board.

29. The translator of claim 10, wherein the plated via in the receiving board does not extend beyond the receiving board.

30. The tester of claim 19, wherein the plated via is constructed to receive an interference fit insertion pin therein.

31. The tester of claim 19, wherein the plated via in the receiving board does not extend into the interface board.

32. The tester of claim 19, wherein the plated via in the receiving board does not extend beyond the receiving board.

* * * * *